(12) United States Patent
Pellizzer

(10) Patent No.: US 11,018,190 B2
(45) Date of Patent: May 25, 2021

(54) THREE-DIMENSIONAL MEMORY APPARATUSES AND METHODS OF USE

(71) Applicant: Micron Technology, Inc., Boise, ID (US)

(72) Inventor: Fabio Pellizzer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/983,987

(22) Filed: Aug. 3, 2020

(65) Prior Publication Data

US 2020/0365659 A1 Nov. 19, 2020

Related U.S. Application Data

(60) Continuation of application No. 15/854,656, filed on Dec. 26, 2017, now Pat. No. 10,734,446, which is a
(Continued)

(51) Int. Cl.
*G11C 11/00* (2006.01)
*H01L 27/24* (2006.01)
(Continued)

(52) U.S. Cl.
CPC ........ *H01L 27/2481* (2013.01); *G11C 13/003* (2013.01); *G11C 13/004* (2013.01);
(Continued)

(58) Field of Classification Search
CPC ............ G11C 13/0004; G11C 13/0026; G11C 13/0028; G11C 13/003; G11C 13/004; G11C 13/0069
See application file for complete search history.

(56) References Cited

U.S. PATENT DOCUMENTS 4,063,224 A 12/1977 Kirschner
7,106,625 B2 9/2006 Yeh
(Continued)

FOREIGN PATENT DOCUMENTS

CN 101847647 A 9/2010
CN 104662659 A 5/2015
(Continued)

OTHER PUBLICATIONS

2nd Office Action dated Jan. 28, 2020 for KR Application No. 10-2018-7015195.
(Continued)

*Primary Examiner* — Pho M Luu
(74) *Attorney, Agent, or Firm* — Dorsey & Whitney LLP

(57) ABSTRACT

A three dimensional (3D) memory array is disclosed. The 3D memory array may include an electrode plane and a memory material disposed through and coupled to the electrode plane. A memory cell included in the memory material is aligned in a same plane as the electrode plane, and the memory cell is configured to exhibit a first threshold voltage representative of a first logic state and a second threshold voltage representative of a second logic state. A conductive pillar is disposed through and coupled to the memory cell, wherein the conductive pillar and electrode plane are configured to provide a voltage across the memory cell to write a logic state to the memory cell. Methods to operate and to form the 3D memory array are disclosed.

20 Claims, 10 Drawing Sheets

Related U.S. Application Data division of application No. 14/932,707, filed on Nov. 4, 2015, now Pat. No. 9,978,810.

(51) Int. Cl.
  *H01L 45/00* (2006.01)
  *G11C 13/00* (2006.01)

(52) U.S. Cl.
  CPC ...... *G11C 13/0004* (2013.01); *G11C 13/0026* (2013.01); *G11C 13/0028* (2013.01); *G11C 13/0069* (2013.01); *H01L 27/2409* (2013.01); *H01L 27/249* (2013.01); *H01L 45/04* (2013.01); *H01L 45/06* (2013.01); *H01L 45/065* (2013.01); *H01L 45/126* (2013.01); *H01L 45/1226* (2013.01); *H01L 45/1233* (2013.01); *H01L 45/141* (2013.01); *H01L 45/143* (2013.01); *H01L 45/144* (2013.01); *H01L 45/16* (2013.01); *H01L 45/1608* (2013.01); *G11C 2013/0073* (2013.01); *G11C 2213/71* (2013.01); *G11C 2213/77* (2013.01)

(56) References Cited

U.S. PATENT DOCUMENTS

| | | |
|---|---|---|
| 7,200,045 B2 | 4/2007 | Lue |
| 7,289,359 B2 | 10/2007 | Kuo et al. |
| 7,295,407 B2 * | 11/2007 | Yuasa .................. B82Y 10/00 360/322 |
| 7,324,377 B2 | 1/2008 | Lee |
| 7,394,680 B2 | 7/2008 | Toda et al. |
| 7,515,461 B2 | 4/2009 | Happ et al. |
| 8,077,505 B2 | 12/2011 | Chen et al. |
| 8,111,541 B2 | 2/2012 | Lai et al. |
| 8,299,571 B2 | 10/2012 | Ozawa et al. |
| 8,450,713 B2 | 5/2013 | Awaya et al. |
| 8,729,523 B2 | 5/2014 | Pio |
| 8,829,646 B2 * | 9/2014 | Lung .................. H01L 27/1021 257/530 |
| 8,841,649 B2 | 9/2014 | Pio |
| 9,105,838 B2 | 8/2015 | Haimoto et al. |
| 9,728,584 B2 | 8/2017 | Ramaswamy et al. |
| 9,799,381 B1 | 10/2017 | Tortorelli et al. |
| 9,805,794 B1 | 10/2017 | Li et al. |
| 9,978,810 B2 * | 5/2018 | Pellizzer .............. G11C 13/003 |
| 10,134,470 B2 | 11/2018 | Tortorelli et al. |
| 10,157,670 B2 | 12/2018 | Pirovano et al. |
| 10,163,506 B2 | 12/2018 | Pirovano et al. |
| 10,418,102 B2 | 9/2019 | Tortorelli et al. |
| 10,446,226 B2 | 10/2019 | Tortorelli et al. |
| 10,600,481 B2 | 3/2020 | Pirovano et al. |
| 10,734,446 B2 * | 8/2020 | Pellizzer .............. G11C 13/0004 |
| 2004/0042259 A1 | 3/2004 | Campbell et al. |
| 2004/0062071 A1 | 4/2004 | Rodriguez et al. |
| 2006/0233019 A1 | 10/2006 | Kostylev et al. |
| 2007/0047300 A1 | 3/2007 | Lee et al. |
| 2008/0025089 A1 | 1/2008 | Scheuerlein et al. |
| 2008/0112211 A1 | 5/2008 | Toda |
| 2008/0205147 A1 | 8/2008 | Santin et al. |
| 2008/0212363 A1 | 9/2008 | Fuji |
| 2009/0020745 A1 | 1/2009 | Jeong et al. |
| 2009/0034325 A1 | 2/2009 | Lowrey et al. |
| 2009/0040813 A1 | 2/2009 | Kang et al. |
| 2009/0109737 A1 | 4/2009 | Kostylev |
| 2009/0154222 A1 | 6/2009 | Chien et al. |
| 2009/0201740 A1 | 8/2009 | Willer et al. |
| 2009/0279350 A1 | 11/2009 | Chen et al. |
| 2010/0020606 A1 | 1/2010 | Yamada |
| 2010/0067291 A1 | 3/2010 | Fuji |
| 2010/0208508 A1 | 8/2010 | Baek et al. |
| 2010/0219392 A1 | 9/2010 | Tabuchi et al. |
| 2010/0226163 A1 | 9/2010 | Savransky |
| 2010/0284211 A1 | 11/2010 | Hennessey |
| 2011/0007545 A1 | 1/2011 | Jin et al. |
| 2011/0294290 A1 | 12/2011 | Nakanishi et al. |
| 2011/0305075 A1 | 12/2011 | Lowrey et al. |
| 2011/0316063 A1 | 12/2011 | Tang et al. |
| 2012/0168705 A1 | 7/2012 | Liu et al. |
| 2012/0327708 A1 | 12/2012 | Du et al. |
| 2013/0026438 A1 | 1/2013 | Wang et al. |
| 2013/0044534 A1 | 2/2013 | Kawai et al. |
| 2013/0044537 A1 | 2/2013 | Ishigaki et al. |
| 2013/0078776 A1 | 3/2013 | Kim et al. |
| 2013/0094275 A1 | 4/2013 | Chen |
| 2013/0135924 A1 | 5/2013 | Pantazi et al. |
| 2013/0200326 A1 | 8/2013 | Ju et al. |
| 2013/0229846 A1 | 9/2013 | Chien et al. |
| 2013/0322167 A1 | 12/2013 | Krebs |
| 2014/0043911 A1 | 2/2014 | Samachisa et al. |
| 2014/0061574 A1 | 3/2014 | Pio |
| 2014/0061577 A1 | 3/2014 | Kanno et al. |
| 2014/0063898 A1 | 3/2014 | Fantini et al. |
| 2014/0077142 A1 | 3/2014 | Choi |
| 2014/0131653 A1 | 5/2014 | Lee et al. |
| 2014/0192585 A1 | 7/2014 | Hashim et al. |
| 2014/0198553 A1 | 7/2014 | Lung |
| 2014/0217349 A1 | 8/2014 | Hopkins |
| 2014/0268998 A1 | 9/2014 | Jo |
| 2015/0044849 A1 | 2/2015 | Pio |
| 2015/0074326 A1 | 3/2015 | Castro |
| 2015/0187416 A1 | 7/2015 | Bedeschi |
| 2015/0243336 A1 | 8/2015 | Karpov et al. |
| 2015/0287460 A1 | 10/2015 | Lee et al. |
| 2015/0311031 A1 | 10/2015 | Platzgummer et al. |
| 2015/0311256 A1 | 10/2015 | Rabkin et al. |
| 2016/0126455 A1 | 5/2016 | Hayashi et al. |
| 2016/0133319 A1 | 5/2016 | Fantini et al. |
| 2016/0225459 A1 | 8/2016 | Boysan et al. |
| 2016/0240249 A1 | 8/2016 | Kellam et al. |
| 2016/0336066 A1 | 11/2016 | Lin et al. |
| 2017/0125097 A1 | 5/2017 | Tortorelli et al. |
| 2017/0330916 A1 | 11/2017 | Hong et al. |
| 2018/0040370 A1 | 2/2018 | Tortorelli et al. |
| 2018/0122468 A1 | 5/2018 | Pirovano et al. |
| 2018/0122472 A1 | 5/2018 | Pirovano et al. |
| 2018/0138240 A1 | 5/2018 | Pellizzer |
| 2018/0138241 A1 | 5/2018 | Pellizzer |
| 2019/0006006 A1 | 1/2019 | Pirovano et al. |
| 2019/0295636 A1 | 9/2019 | Tortorelli et al. |
| 2019/0325957 A1 | 10/2019 | Tortorelli et al. |

FOREIGN PATENT DOCUMENTS

| | | |
|---|---|---|
| CN | 104871313 A | 8/2015 |
| JP | 2005012186 A | 1/2005 |
| JP | 2005514719 A | 5/2005 |
| JP | 2006514392 A | 4/2006 |
| JP | 2006514393 A | 4/2006 |
| JP | 2006324625 A | 11/2006 |
| JP | 2007220281 A | 8/2007 |
| JP | 2008217889 A | 9/2008 |
| JP | 2009534835 A | 9/2009 |
| JP | 2010092521 A | 4/2010 |
| JP | 2010244607 A | 10/2010 |
| JP | 20100287872 A | 12/2010 |
| JP | 2013114726 A | 6/2013 |
| KR | 20090057232 A | 6/2009 |
| KR | 20120073086 A | 7/2012 |
| KR | 20130095959 A | 8/2013 |
| KR | 20150046165 A | 4/2015 |
| TW | 201145279 A | 12/2011 |
| TW | 201212318 A | 3/2012 |
| TW | 201515197 A | 4/2015 |
| WO | 2003054887 A1 | 7/2003 |
| WO | 2004084229 A1 | 9/2004 |
| WO | 2011087038 A1 | 7/2011 |
| WO | 2011121970 A1 | 10/2011 |
| WO | 2014103577 A1 | 7/2014 |
| WO | 20140176075 A1 | 10/2014 |
| WO | 2017078932 A1 | 5/2017 |
| WO | 2017078988 A1 | 5/2017 |

(56) References Cited

FOREIGN PATENT DOCUMENTS

| | | |
|---|---|---|
| WO | 2018031217 A1 | 2/2018 |
| WO | 2018080615 A1 | 5/2018 |

OTHER PUBLICATIONS

3rd Office Action dated Jun. 4, 2020 for KR Application No. 10-2018-7015195, 3 pgs.
English translation of Decision of Rejection for Application No. 2018-522575, dated Apr. 21, 2020.
English Translation of First Office Action for Korean Application No. 10-2018-7015196 dated Sep. 2, 2019.
English Translation of Third Office Action dated Jul. 11, 2019 for Taiwan application No. 106128742.
EP Office Action dated Jul. 3, 2020 for EP Application No. 16862692.7, 4 pgs.
EP Search Report for Application No. 16862692.7 dated May 24, 2019.
Extended EP Search Report dated Feb. 19, 2020 for EP Application No. 17839997.8, 8 pages.
First Office Action dated Jul. 24, 2017 for Taiwan Application No. 105135964.
First Office Action dated Jul. 5, 2019 for Korean application No. 10-2018-7015195.
First Office Action dated Mar. 13, 2018 for Taiwanese Application No. 106126746.
First Office Action received for TW Application No. 106128742, dated Jun. 19, 2018.
International Preliminary Report on Patentability dated Feb. 12, 2019 for PCT Application No. PCT/US2017/043245, 12 pages.
International Search Report and Written Opinion dated Nov. 22, 2017 for PCT Application No. PCT/US2017/046585.
International Search Report and Written Opinion dated Oct. 30, 2017 for PCT Application No. PCT/US2017/043245.
IPRP dated May 9, 2019 for PCT application No. PCT/US2017/046585.
JP Office Action dated Jun. 16, 2020 for JP Application No. 2019-506397, 8 pgs.
KR Office Action dated Jun. 26, 2020 for KR Application No. 10-2019-7005610, 8 pgs.
Notice of Rejection Grounds dated Jul. 9, 2019 for JP Application No. 2018-5225575.
Office Action dated Mar. 26, 2018 for Taiwanese Application No. 105136005.
Office Action dated Mar. 6, 2018 for Taiwanese Application No. 105135964.
Second Office Action dated Feb. 20, 2019 for TW Application No. 106128742.
Decision of the Intellectual Property Office for TW application No. 105135964 dated Oct. 5, 2018, pp. all.
"Extended European Search Report dated May 10, 2019 for Appl. No. 16862719".
"ISR/WO dated Feb. 3, 2017 for appln No. PCT/US2016/058714".
"ISR/WO dated Feb. 2, 2017 for Appln No. PCT/US2016/057649".
"Translation of JP Office Action dated Apr. 23, 2019 for Appl. No. 2018-522576", 7 pgs.
Chen, et al., "An Access-Transistor-Free (0T/1R) Non-Volatile Resistance Random Access Memory (RRAM) Using a Novel Threshold Switching, Self-Rectifying Chalcogenide Device", Electron Devices Meeting, Dec. 2003. IEDM '03 Technical Digest. IEEE International; 4 pages.
Kang, J.F. et al., Scaling and Operation Characteristics of HFOX Based Vertical RRAM for 3D Cross-Point Architecture, IEEE Jul. 2014, 4 pages.
4th Office Action dated Aug. 4, 2020 for KR Application No. 10-2018-7015195.
EP Office Action dated Sep. 16, 2020 for EP Application No. 16862719.8.
JP Office Action dated Sep. 8, 2020 for JP Application No. 2019-161800.
KR Office Action dated Nov. 12, 2020 for KR Application No. 10-2020-7025118.
English translation of 1$^{st}$ Office Action for CN Application No. 201680071347.2, dated Jan. 29, 2021.

\* cited by examiner

THREE-DIMENSIONAL MEMORY APPARATUSES AND METHODS OF USE

CROSS-REFERENCE TO RELATED APPLICATION(S)

This application is a continuation of U.S. patent application Ser. No. 15/854,656, filed Dec. 26, 2017 and issued as U.S. Pat. No. 10,734,446 on Aug. 4, 2020, which is a divisional of U.S. patent application Ser. No. 14/932,707 filed on Nov. 4, 2015 and issued as U.S. Pat. No. 9,978,810 on May 22, 2018, which is incorporated herein by reference, in their entirety, for any purpose.

BACKGROUND

Traditional memory devices include a memory element that is used to store a logic state coupled to a selector device. The memory element and selector device may be located at an intersection of a word line and a bit line in a memory array having a three-dimensional architecture. The selector may be coupled to the word line and the memory element may be coupled to the bit line in some architectures. The selector device may reduce leakage currents and be used to select a single memory element for reading and/or writing. However, the use of separate memory elements and selector devices increases the number of materials and/or layers that must be formed during fabrication of the memory device. Activating the selector device and writing to or reading the memory element may require high voltage, high current density, and/or long duration pulses to be provided. These memory requirements may necessitate specific structural solutions that may increase manufacturing complexity and/or cost. The operation requirements may also increase power consumption of the memory device.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

A three-dimensional memory array including a plurality of memory cells may be implemented with memory cells that act as selector devices and memory elements. A memory cell may be a single material between electrodes in some embodiments. This may facilitate a simplified architecture for a three-dimensional memory array and/or other memory architectures. The simplified architecture may require fewer materials, layers, and/or structures, which may reduce processing steps during manufacture. A logic state may be written to the memory cell to store the logic state. The logic state may correspond to one or more bits of data. Voltages of different polarity may be applied to write a logic state to the memory cell. The memory cell may be read by applying voltages of a single polarity. The writing and reading protocols may take advantage of different threshold voltages of the memory cell that result from the different polarities. The memory cell may require short, low power pulses to read and write. In some embodiments, the memory cell may include a chalcogenide. The chalcogenide may not undergo a phase change during reading and/or writing.

Figure 1:
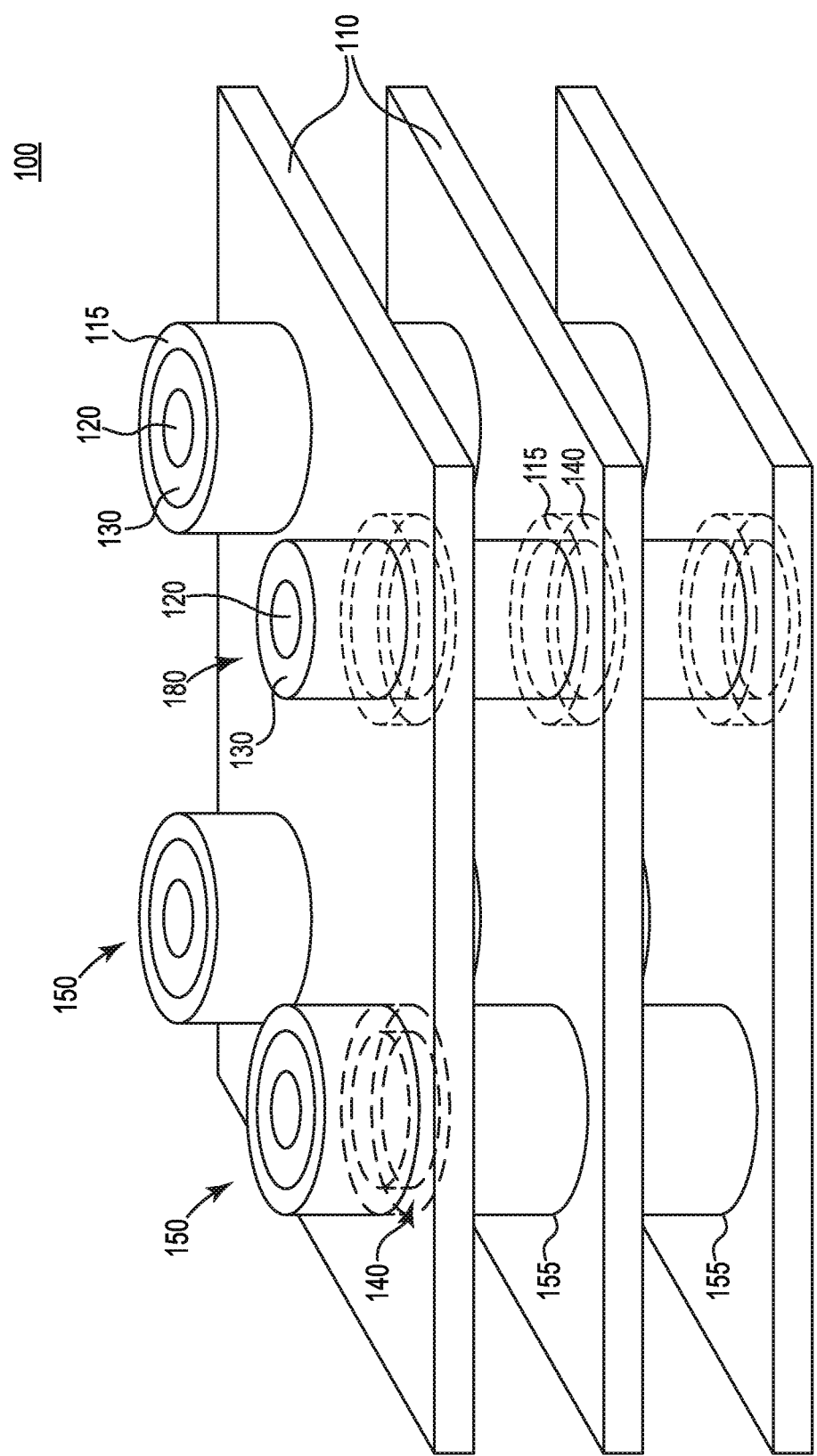
FIG. 1 is an isometric view of the portion of the three dimensional memory array according to an embodiment of the disclosure.

FIG. 1 is an isometric view of a portion of a three-dimensional (3D) memory array 100 according to an embodiment of the disclosure. The memory array 100 may include one or more electrode planes 110. The electrode planes 110 may be separated by layers of dielectric material. The alternating electrode planes 110 and dielectric material form a stack. Memory columns 150 are disposed in openings 155 in the stack. A memory column 150 includes a conductive pillar 120, an electrode cylinder 130, and memory material 115. Memory cells 140 are formed from the memory material 115. The memory cells 140 are ring-shaped and are associated with a respective electrode plane 110. The memory cells 140 of each respective electrode plane 110 may be vertically aligned along a memory column 150. In some embodiments, the memory cells 140 associated with a respective electrode plane 110 are aligned in the same plane as the respective electrode plane 110. By aligned in the same plane, it is meant that at least a portion of the memory cell 140 is disposed at an overlapping position along a length of the memory column 150 of at least a portion of the electrode plane 110. In some embodiments, the entire memory cell 140 may be aligned in the plane of the electrode plane 110. In some embodiments, memory cell 140 may have a thickness that is equal to or less than a thickness of the electrode plane 110. In some embodiments, a portion of the memory cell 140 may extend above and/or below the plane of the electrode plane 110. In some embodiments, the memory cell 140 may have a thickness that is greater than a thickness of the electrode plane 110.

In the embodiment of FIG. 1, the conductive pillar 120, electrode cylinder 130, and memory material 115 of the memory columns 150 are formed as concentric cylinders. In some embodiments, the conductive pillar 120, electrode cylinder 130, and memory material 115 may be formed as other concentric shapes. The memory material 115 may include a chalcogenide. In some embodiments, the chalcogenide material may be a phase change material. In some embodiments, the memory material 115 may include a ternary composition that may include selenium (Se), arsenic (As), and germanium (Ge). In some embodiments, the memory cell 115 may include a quaternary composition that may include tellurium (Te), Se, As, and Ge. Other materials may also be used. In some embodiments, the memory material 115 may be selectively deposited in the same plane as the electrode plane 110 to form memory cell 140. This alternative embodiment is shown in FIG. 1 as memory column 180. As shown with memory column 180, the memory material 115 may not extend the entire length of the column 150.

Figure 2A:
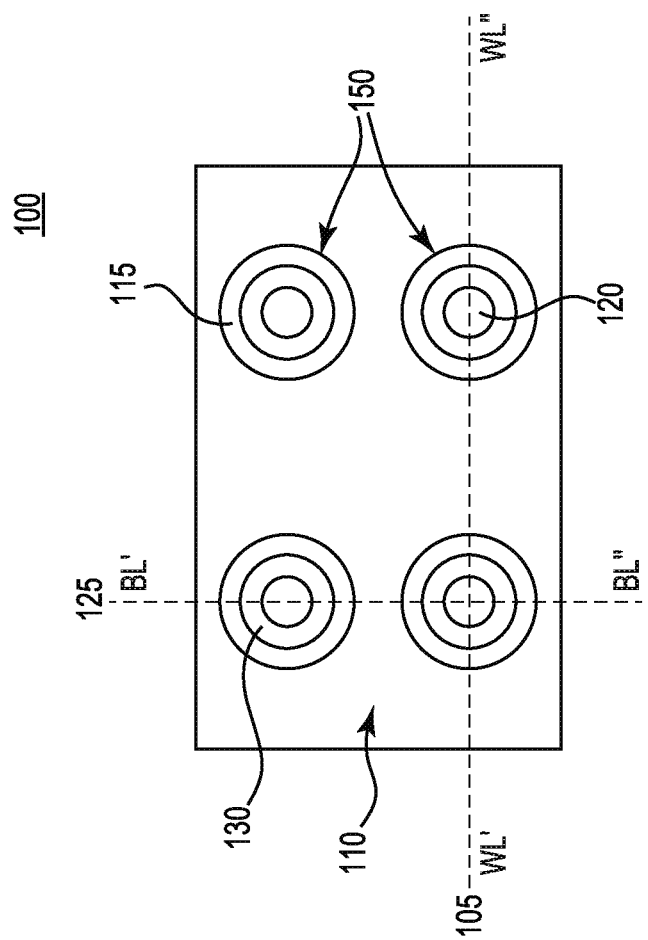
FIG. 2A is a top-down view of a portion of a three dimensional memory array according to an embodiment of the disclosure.
Figure 2C:
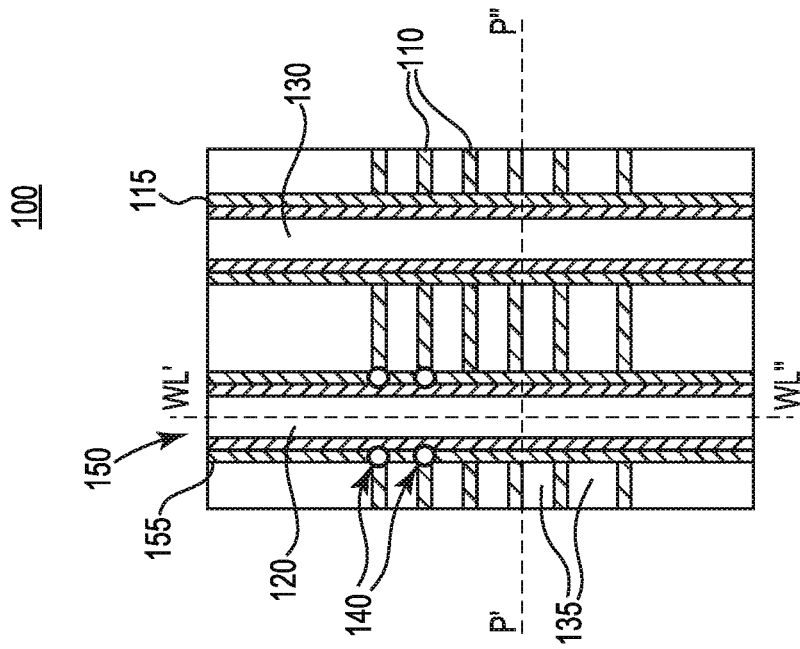
FIG. 2C is a bit line view of the portion of the three dimensional memory array shown in FIG. 2A.
Figure 2B:
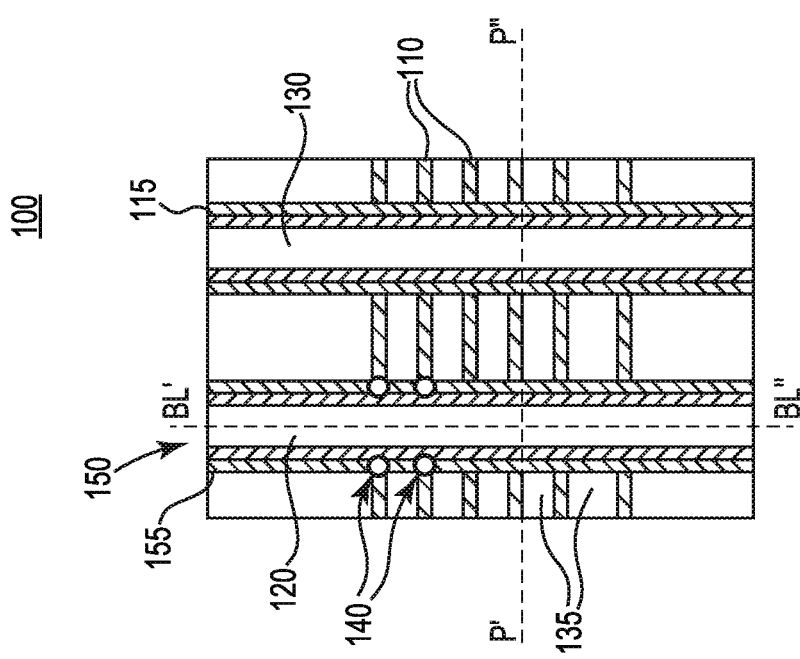
FIG. 2B is a word line view of the portion of the three dimensional memory array shown in FIG. 2A.

FIGS. 2A-C are illustrations of the portion of the 3D memory array 100 shown in FIG. 1. FIG. 2A is a top-down view of the portion of the 3D memory array 100. While FIG. 2A illustrates one electrode plane 110, it will be appreciated that the memory array 100 may include additional electrode planes 110. With reference to FIG. 2A, the memory columns 150 extend into the page as viewed by a reader. The memory columns 150 extending through the 3D memory array 100 may be seen in FIGS. 1, 2B, and 2C. Ring shaped memory cells 140 (Shown in FIGS. 2B and 2C) are aligned in the electrode plane 110, resulting from the memory columns 150 (FIG. 1) formed in the openings 155 in the stack of electrode planes 110 and dielectric material. As previously discussed, the memory cells 140 are formed from the memory material 115 and may be ring-shaped in the plane of the electrode plane 110. Although shown as a ring-shape in the embodiment illustrated in FIGS. 1 and 2A-C, the memory material 115 may be formed as other shapes (e.g., rectangle, oval, irregular).

The memory material 115 may be coupled to the one or more electrode planes 110 to form the memory cells 140. The memory material 115 may be further coupled to a conductive pillar 120. The conductive pillar 120 may extend through the stack of electrode planes and dielectric material. That is, it would extend into the page as viewed by a reader. The conductive pillar 120 extending through the stack may be seen in FIGS. 1, 2B, and 2C, where the conductive pillar 120 extends parallel to the plane of the page. Although shown as a cylinder-shape in the embodiment illustrated in FIGS. 1 and 2A-C, the conductive pillar 120 may be formed as other shapes (e.g., rectangle, oval, irregular). In some embodiments, the memory material 115 may be coupled to the conductive pillar 120 via an electrode cylinder 130. The electrode cylinder 130 may comprise a barrier material in some embodiments. The electrode cylinder 130 may extend into the stack of electrode planes 110 and dielectric material similar to the memory material 115 and conductive pillar 120. Although shown as a ring-shape in FIGS. 1 and 2A-C, the electrode cylinder 130 may be shaped to conform to the outer surface of the conductive pillar 120.

As shown in FIG. 2A, the 3D memory array 100 may include multiple conductive pillars 120 surrounded by memory material 115. The conductive pillars 120 and memory material 115 may be arranged in a grid and/or other array pattern. In some embodiments, the conductive pillars 120 may be coupled to memory access lines (e.g., word lines and bit lines). As shown in FIG. 2A, the conductive pillars 120 may be arranged in a word line (WL) 105 direction and a bit line (BL) 125 direction. Although the terms word line and bit line are used herein, it is understood that both word lines and bit lines may generally operate and be referred to as memory access lines. The terms word line and bit line are not meant to be limiting but are used herein to assist the reader in understanding what memory access line is being referred to in the description. As shown in FIG. 2A, the WL 105 extends horizontally, and the BL 125 extends vertically. Each of the electrode planes 110 may be coupled to one or more memory access lines. In some embodiments, the electrode planes 110 are coupled to word lines and the pillars 120 are coupled to bit lines. Other configurations of coupling memory access lines to the 3D memory array 100 may be used.

FIG. 2B is a word line view of the memory array 100 shown in FIG. 2A. The view in FIG. 2B is the plane indicated by the dotted line labeled WL'-WL" in FIG. 2A. The view shown in FIG. 2A corresponds to the dotted line labeled P'-P" in FIG. 2B. FIG. 2C is a bit line view of the memory array 100 shown in FIGS. 2A and 2B. The view in FIG. 2C is the plane indicated by the dotted line labeled BL'-BL" in FIGS. 2A and 2B. Multiple electrode planes 110 may be seen in the view shown in FIGS. 2B and 2C. The memory array 100 may include any number of electrode planes 110. The electrode planes 110 may be parallel to each other in some embodiments. The electrode planes 110 may be separated by layers of dielectric material 135. The memory material 115 may have a memory cell 140 aligned with the plane of the electrode plane 110. In some embodiments, the memory cell 140 is ring-shaped. In some embodiments, the memory cell 140 may have a vertical thickness corresponding to the thickness of the electrode plane 110. The vertical distance between electrode planes 110 may be sufficient to prevent the memory cells 140 in the memory material 115 aligned with each electrode plane 110 from interfering with each other. This may facilitate the use of a memory column 150 to provide memory cells 140 without the need to form isolation regions between the memory cells 140 along the memory material 115.

In the embodiment illustrated in FIGS. 2A-C, FIG. 2C is identical to FIG. 2B because of the symmetry in the word line and bit line directions. However, in some embodiments, such as when the array is not symmetrical between the word line and bit line directions, the views along the word line and bit line may not be identical.

The memory array 100 shown in FIGS. 1 and 2A-C may be formed by various thin film techniques including, but not limited to, spin coating, blanket coating, chemical vapor deposition (CVD) such as low pressure CVD, plasma enhanced chemical vapor deposition (PECVD), atomic layer deposition (ALD), plasma enhanced ALD, physical vapor deposition (PVD), thermal decomposition, and/or thermal growth, among others. Alternatively, materials may be grown in situ. While the materials described and illustrated herein may be formed as layers, the materials are not limited thereto and may be formed in other three-dimensional configurations.

Figure 3A:
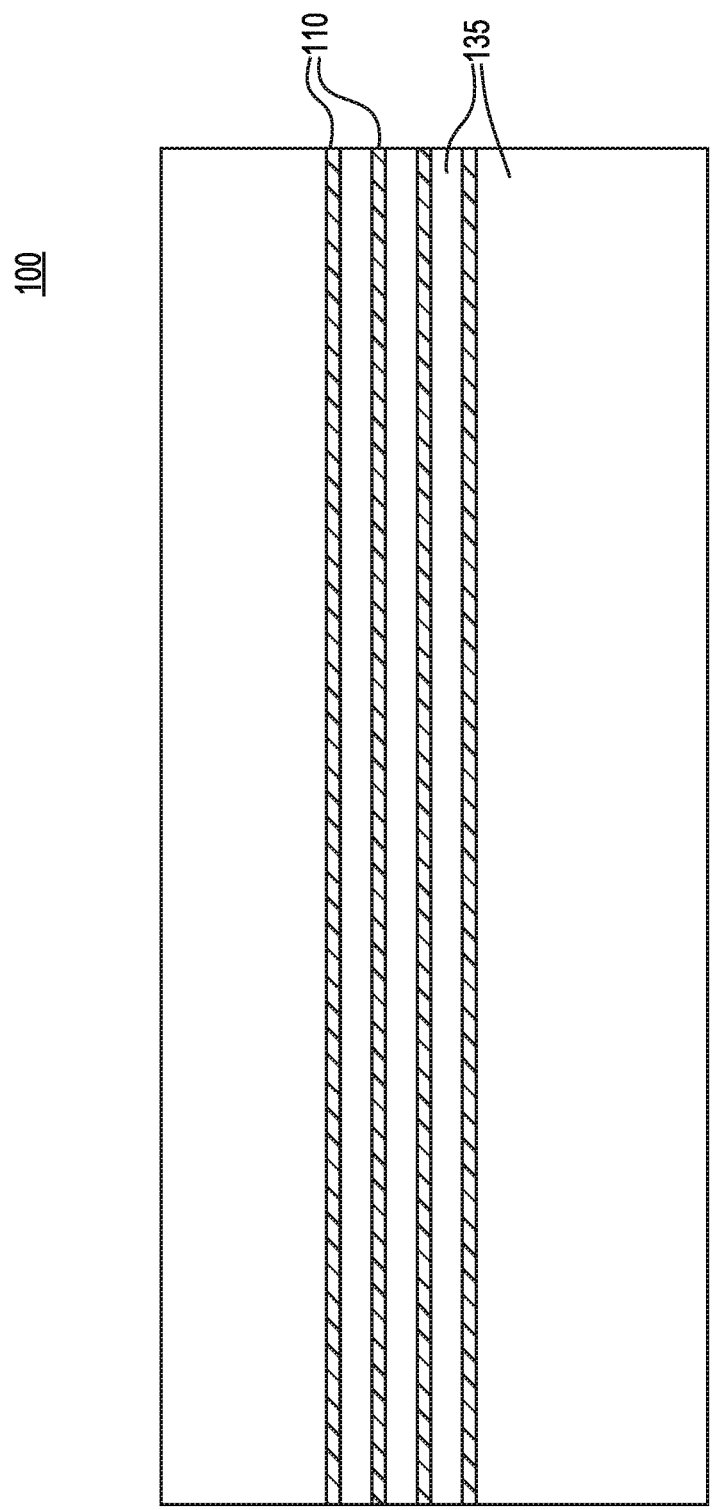
FIG. 3A is a schematic illustration of a portion of partially fabricated memory array according to an embodiment of the disclosure.
Figure 3B:
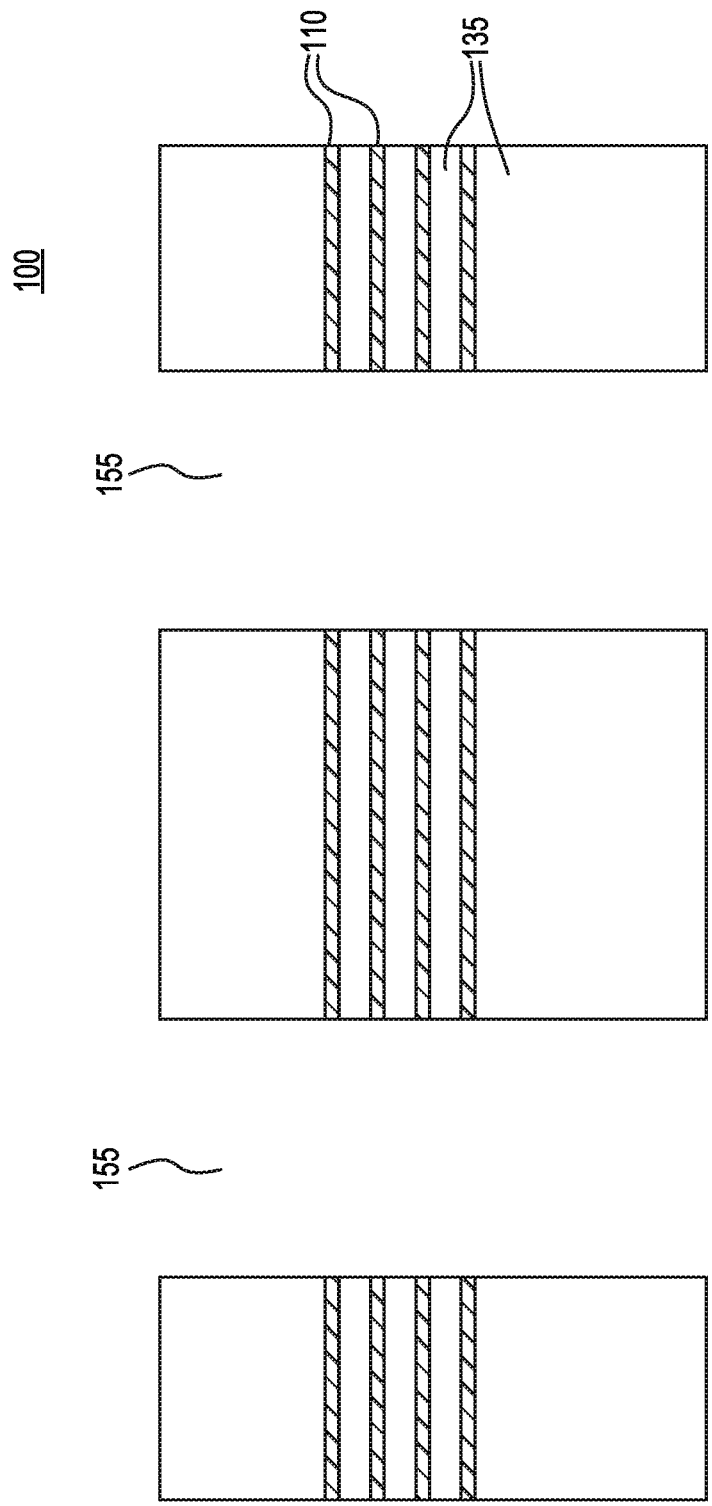
FIG. 3B is a schematic illustration of a portion of a partially fabricated memory array according to an embodiment of the disclosure.
Figure 3C:
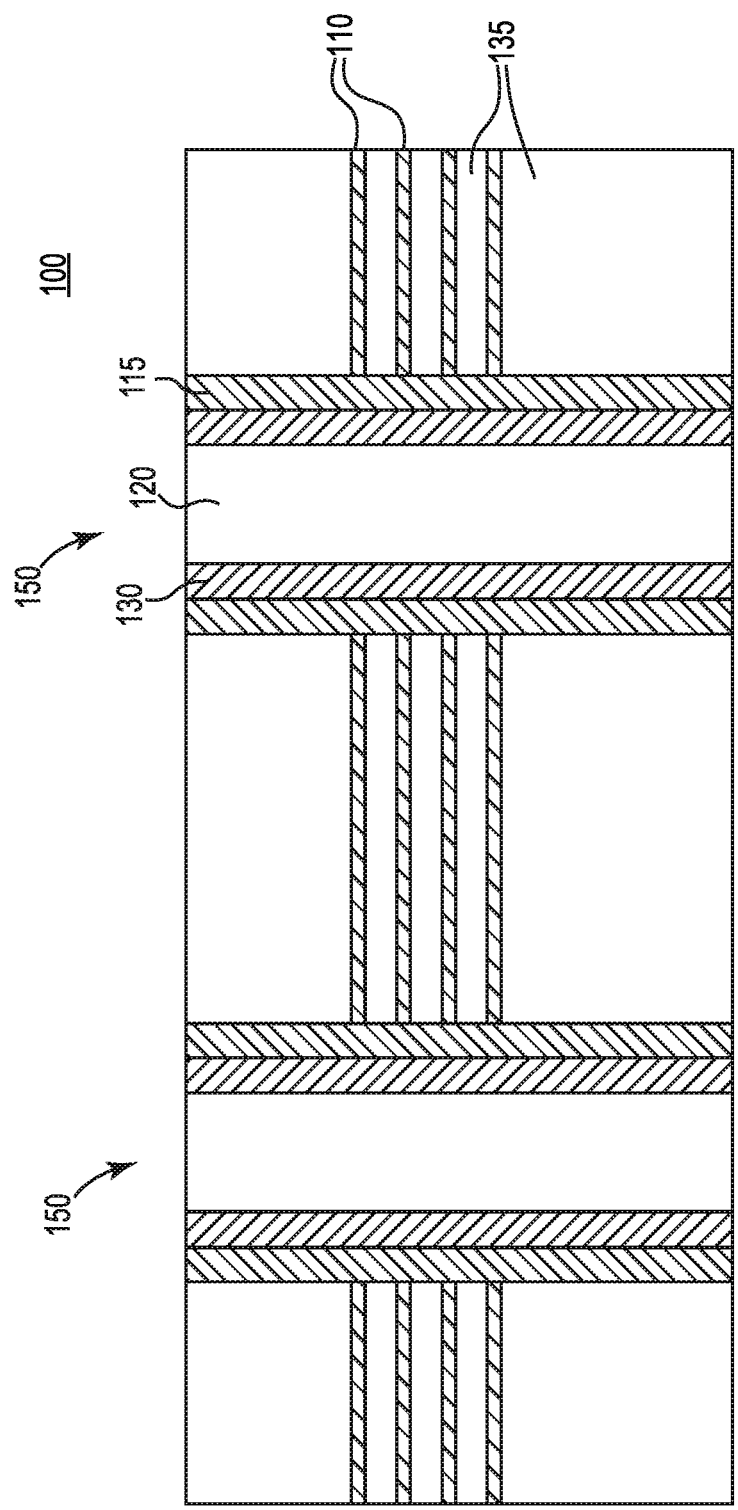
FIG. 3C is a schematic illustration of a portion of a memory array according to an embodiment of the disclosure.

FIGS. 3A-C show a portion of a memory array 100 at different steps of fabrication. As shown in FIG. 3A, the electrode planes 110 and dielectric material 135 may be deposited as alternating layers to form a stack. The electrode planes 110 may be formed of a metallic material, a polysilicon material, and/or other conductive material. The dielectric material 135 may be an oxide or other suitable insulating material. The electrode planes 110 and/or dielectric material 135 may be thin films. As shown in FIG. 3B, openings 155 may be formed in the stack of electrode planes 110 and dielectric material 135. The openings 155 may be formed by etching, milling, and/or other known technique. In some embodiments, a mask may be employed to align the openings 155 on the stack. As shown in FIG. 3C, memory columns 150 are formed in the openings 155 in the stack of electrode planes 110 and dielectric material 135. A conformal layer may be formed in the openings to form the memory material 115. The electrode cylinder 130 may be formed from a second conformal layer, and a conductive pillar 120 is formed to fill the remaining opening. In some embodiments, the electrode cylinder 130 may be omitted. Alternatively, the openings 155 may be filled with the memory material 115 then a second set of openings formed in the memory material 115. The second set of openings may be filled with the electrode cylinder 130 and a third set of openings formed in the electrode cylinder 130. The third set of openings may be filled to form the conductive pillars 120. A combination of forming openings and depositing conformal layers within the openings may also be used. The conductive pillars 120 and electrode planes 110 may then be coupled to memory access lines included in a memory array.

In some embodiments, not shown in FIGS. 3A-C, recesses may be formed in each of the electrode planes 110 after openings 155 are formed. A conformal layer of memory material 115 may be selectively formed in the recesses. In some embodiments, this may selectively provide memory material 115 in the same plane as the electrode planes 110 without providing memory material 115 in the same plane as the dielectric material 135.

The memory cell 140 may be written to store one of at least two different logic states (e.g., '1,' '0') by a write operation. In some embodiments, a memory material 115 may include multiple memory cells 140 and each of the memory cells 140 may be independently written to store one of the at least two logic states. In some embodiments, the different logic states may be defined by different threshold voltages ($V_{TH}$) of the memory cell 140. The threshold voltage exhibited by the memory cell 140 may be based on a polarity of a write pulse applied to the memory cell 140 during a write operation and on a polarity of a read pulse applied to the memory cell 115 during a read operation. The write pulse and read pulse may be applied to the memory cell 140 using the electrode plane 110 and conductive cylinder 120.

The memory cell 140 may be configured as a two-terminal device between the electrode plane 110 and conductive cylinder 120 in some embodiments. A first logic state may be written to the memory cell 140 by applying a voltage (e.g., a write pulse) across the memory cell 140 in a first polarity. A second logic state may be written to the memory cell 140 by applying a voltage (e.g., a write pulse) across the memory cell 140 in a second polarity, which may be opposite to the first polarity. The memory cell 140 is read by applying a voltage (e.g., a read pulse) across the terminals. The memory cell 140 may always be read with the same polarity. For example, in some embodiments, the memory cell 140 is read by applying a voltage across the memory cell 140 in the first polarity. In other embodiments, the memory cell 140 is read by applying a voltage across the memory cell 140 in the second polarity. When the memory cell 140 is read with the same voltage polarity with which it was written, the memory cell 140 may exhibit a first $V_{TH}$. When the memory cell 140 is read with the opposite voltage polarity with which it was written, the memory cell 140 may exhibit a second $V_{TH}$. The different threshold voltages may be used to represent different logic states.

When the memory cell 140 is a two-terminal device, the relative values of the voltages between the terminals determines the magnitude and polarity applied across the memory cell 140. For example, providing a voltage of 3V to the conductive cylinder 120 and 0V to the electrode plane 110 applies the same magnitude and polarity as providing a voltage of 6V to conductive cylinder 120 and 3V to electrode plane 110. As used herein, forward polarity indicates that the conductive cylinder 120 is set at a higher voltage than the electrode plane 110 and reverse polarity indicates that the conductive cylinder 120 is set at a lower voltage than the electrode plane 110. However, the use of "forward" and "reverse" polarities is by way of example, and the embodiments of the invention are not limited to those of the particular polarity direction described herein.

Figure 4:
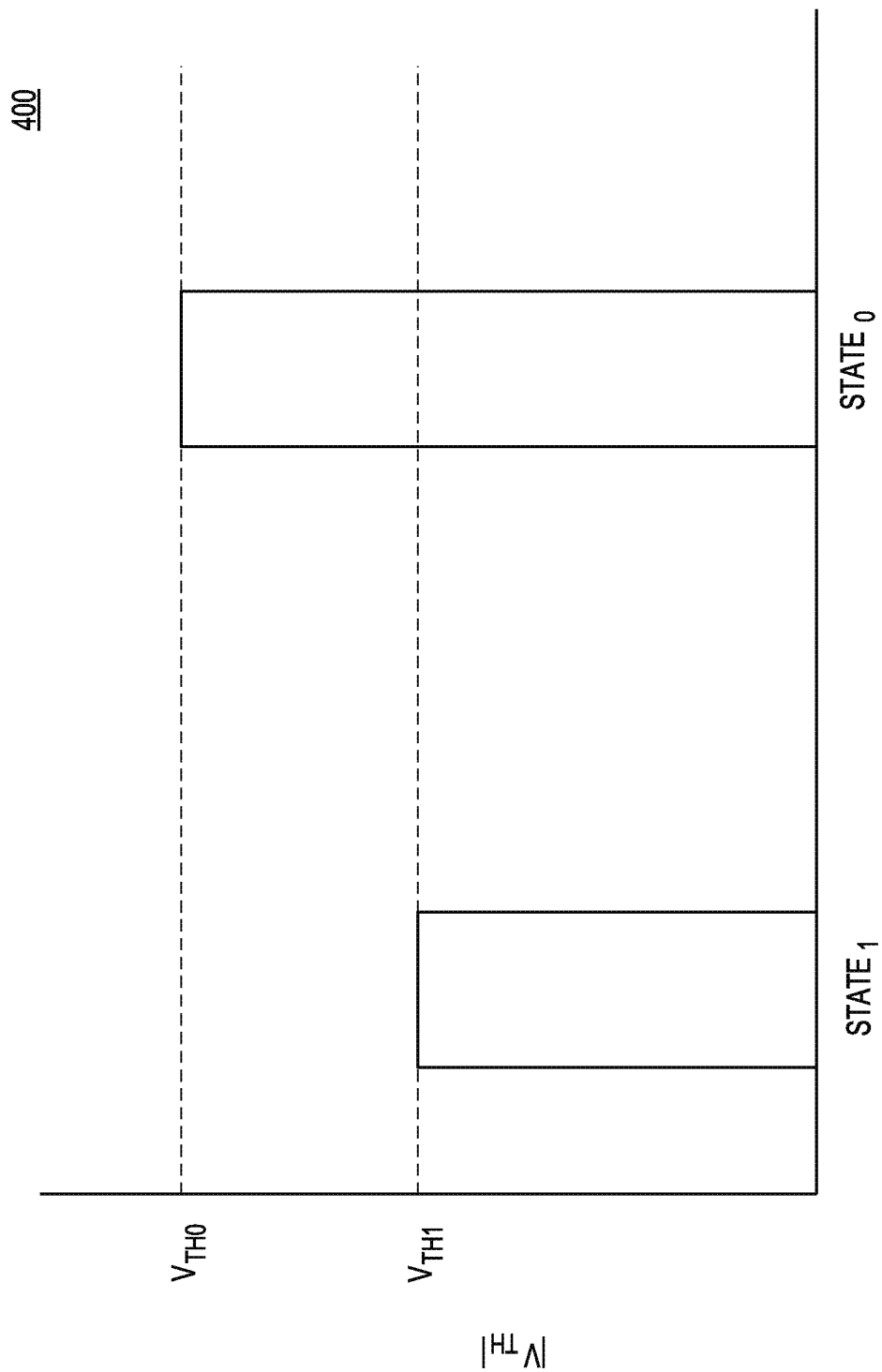
FIG. 4 is a voltage plot of threshold voltages according to an embodiment of the disclosure.

FIG. 4 is a voltage plot 400 of threshold voltages $V_{TH1}$, $V_{TH0}$ for two logic states $State_1$, $State_0$ of a memory cell according to an embodiment of the disclosure. The threshold voltages of the memory cell are the threshold voltages observed when the memory cell is read. The memory cell may be read using a read voltage in the same polarity each time it is read, for example, in forward polarity. $V_{TH1}$ may be observed in the memory cell when the memory cell was written to in the same polarity as the read voltage. For example, the memory cell may have been written to in a forward polarity and is then read in forward polarity. $V_{TH1}$ may correspond to logic $State_1$. Conversely, $V_{TH0}$ may be observed in the memory cell when the memory cell was written to in the opposite polarity as the read voltage. For example, the memory cell may have been written to in a reverse polarity and is then read in a forward polarity. $V_{TH0}$ may correspond to logic $State_0$. As illustrated by FIG. 4, in some embodiments, different threshold voltages may be observed for the memory cell written and read in opposite polarities in comparison to the memory cell written and read in the same polarity.

Figure 5:
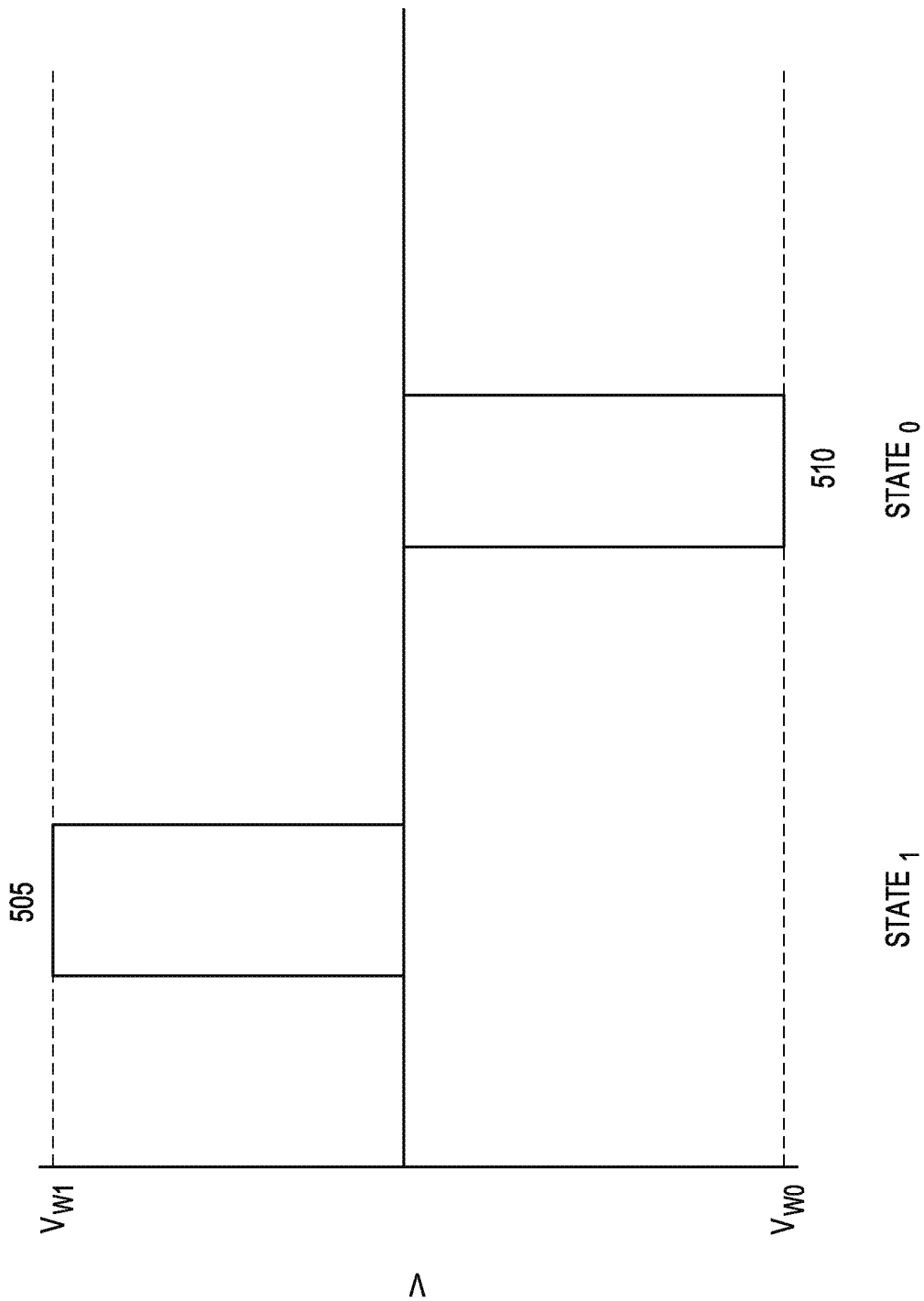
FIG. 5 is a voltage plot of write pulse voltages according to an embodiment of the disclosure.

FIG. 5 is a voltage plot 500 of two write pulses 505, 510 according to an embodiment of the disclosure. The write pulses 505, 510 may be used to write a logic state to a memory cell, such as memory cell 140 shown in FIGS. 1 and 2A-C, during a write operation. The write pulses may be applied by providing a first voltage to the conductive pillar and providing a second voltage to the electrode plane. The resulting voltage applied to the memory cell is the difference between the first and second voltages. The write pulses may be the same duration as read pulses. In some embodiments the duration is 10 ns-50 ns. In some embodiments, the duration is 1-100 ns. Writing to the memory cell may take the same time as reading the memory cell in some embodiments.

The polarity of the write pulses may be either a first polarity or a second polarity (e.g., forward or reverse). Write pulse 505 may apply a voltage $V_{W1}$ to a memory cell in a first polarity (e.g., conductive cylinder at 6V and electrode plane at 0V). The polarity of the write pulse 505 may be the same as the polarity of read pulses. This may write a first logic state ($State_1$) to the memory cell. As shown in FIG. 4, when write pulse 505 writes $State_1$ to the memory cell, the memory cell exhibits threshold voltage $V_{TH1}$ when read.

Write pulse 510 may apply a voltage $V_{W0}$ to the memory cell in a second polarity (e.g., conductive cylinder at −6V and electrode plane at 0V). Write pulse 510 may have the opposite polarity of write pulse 405 and read pulses. Write pulse 510 may write a second logic state ($State_0$) to the memory cell. As shown in FIG. 4, when write pulse 510 writes $State_0$ to the memory cell, the memory cell exhibits threshold voltage $V_{TH0}$ when read.

In some embodiments $V_{W0}$ and $V_{W1}$ may have the same voltage magnitude. In some embodiments, $V_{W0}$ and $V_{W1}$ may have different magnitudes. The magnitudes of $V_{W0}$ and $V_{W1}$ may be selected to be greater than or equal to the greater of threshold voltages $V_{TH0}$ and $V_{TH1}$ of $State_0$ and $State_1$, respectively. For example, $|V_{W0}|=V_{W1}=6V$, $V_{TH1}=4.5V$, and $V_{TH0}=5.5V$. In some embodiments, the write pulses may have the same magnitude as read pulses. In some embodiments, the write pulses may have greater magnitudes than the read pulses.

As illustrated in FIGS. 4-5, the observed threshold voltage of a memory cell during a read operation may be set to different threshold voltages based, at least in part, on the polarity of the voltage applied to write to the memory cell and the polarity of the voltage applied subsequently to read the memory cell. The different threshold voltages may be used to correspond to different logic states. In some embodiments, the memory cell may act as a two-terminal threshold switching type device. That is, below the threshold voltage, the device is 'off' and conducts little or no current. Above the threshold voltage, the device is 'on' and conducts a current and/or a current above the threshold current. The different threshold voltages, which result from reading and writing with particular pulse polarities may allow the memory cell to act as both a selector device and a memory element. This may facilitate the use of memory arrays having less complex architectures.

Figure 6:
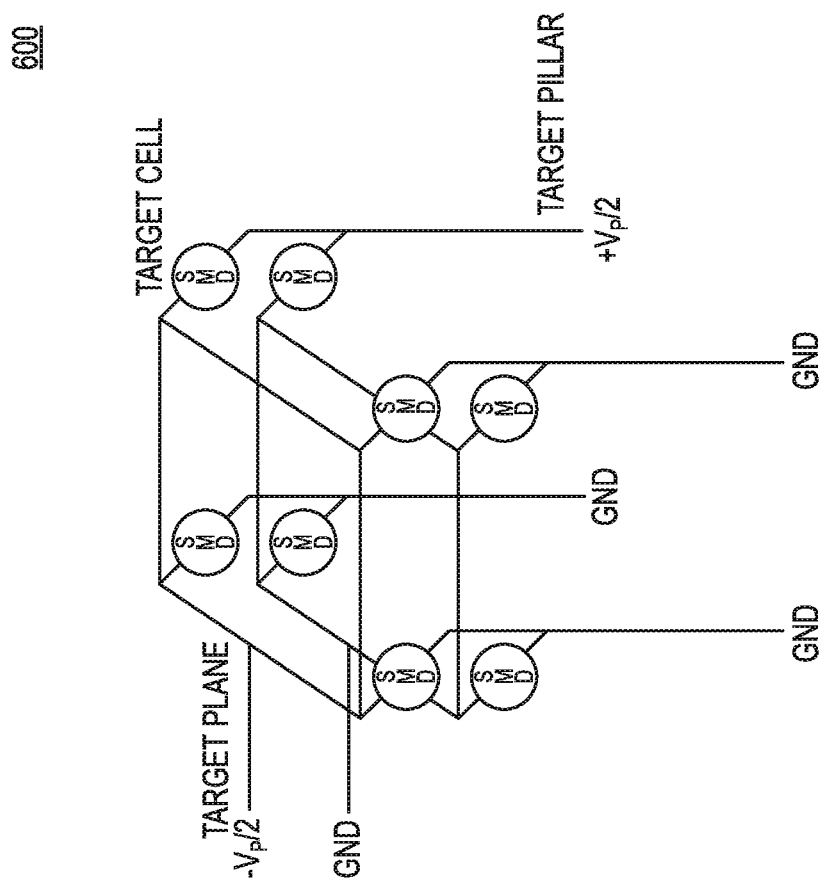
FIG. 6 is a functional diagram of a portion of a three dimensional memory array according to an embodiment of the disclosure.

FIG. 6 is a functional diagram of a portion of a 3D memory array 600 according to an embodiment of the disclosure. The memory cells are labeled SMD in FIG. 6. SMD stands for "selector and memory device" as in some embodiments, the memory cell acts as both the selector device and memory element. To write to a memory cell of a memory array, a single conductive pillar and a single electrode plane may be selectively targeted via memory access lines. This may facilitate addressing and writing to each individual memory cell of the 3D memory array 600. Initially all conductive pillars and electrode planes may be coupled to a common voltage (e.g., ground). To write to a target cell with a positive polarity at $+V_P$ (e.g., $V_{W1}$ shown in FIG. 5), a conductive pillar of the memory cell may be biased to $+V_P/2$ and a desired electrode plane may be biased to $-V_P/2$. The target memory cell may experience a bias voltage of $+V_P$. The remaining non-target memory cells may experience $+/-V_P/2$ or no bias. To write to a target cell with a negative polarity at $-V_P$ (e.g., $V_{W0}$ shown in FIG. 5), a conductive pillar of the memory cell may be biased to $-V_P/2$ and a desired electrode plane may be biased to $+V_P/2$. The target memory cell may experience a bias voltage of $-V_P$. The remaining non-target memory cells may experience $+/-V_P/2$ or no bias (e.g., 0V).

A target cell may be read in a similar manner by biasing the target cell with a voltage $V_R$, but the target cell may always be biased with the same polarity for all read operations. As discussed previously, $V_R$ may be equal to, less than, or greater than $V_P$. In some embodiments, $V_R$ may be higher than V-m and lower than $V_{TH2}$. In some embodiments, similar voltage partitioning between an addressed conductive pillar and addressed electrode plane may be used as during a write operation. The remaining non-target memory cells may experience $+/-V_R/2$ or no bias (e.g., 0V).

In some embodiments, selecting a single conductive pillar and single electrode plane coupled to memory access lines to select a memory cell may use three levels of decoding circuitry (not shown) to decode address information. The address information may correspond to a specific memory cell. In some embodiments, the address information may be received by the decoding circuitry from a memory controller (not shown). Two levels of circuitry may be used to select the conductive pillar. The conductive pillar may be included in a two-dimensional array of conductive pillars. The decoding circuitry to select the conductive pillar may be similar to decoding circuitry for two-dimensional memory arrays. A third level of decoding circuitry may be used to select the electrode plane. Other decoding circuitry configurations may be used. For example, the electrode planes may be configured to correspond to word lines, and the conductive pillars configured to correspond to bit lines.

Figure 7:
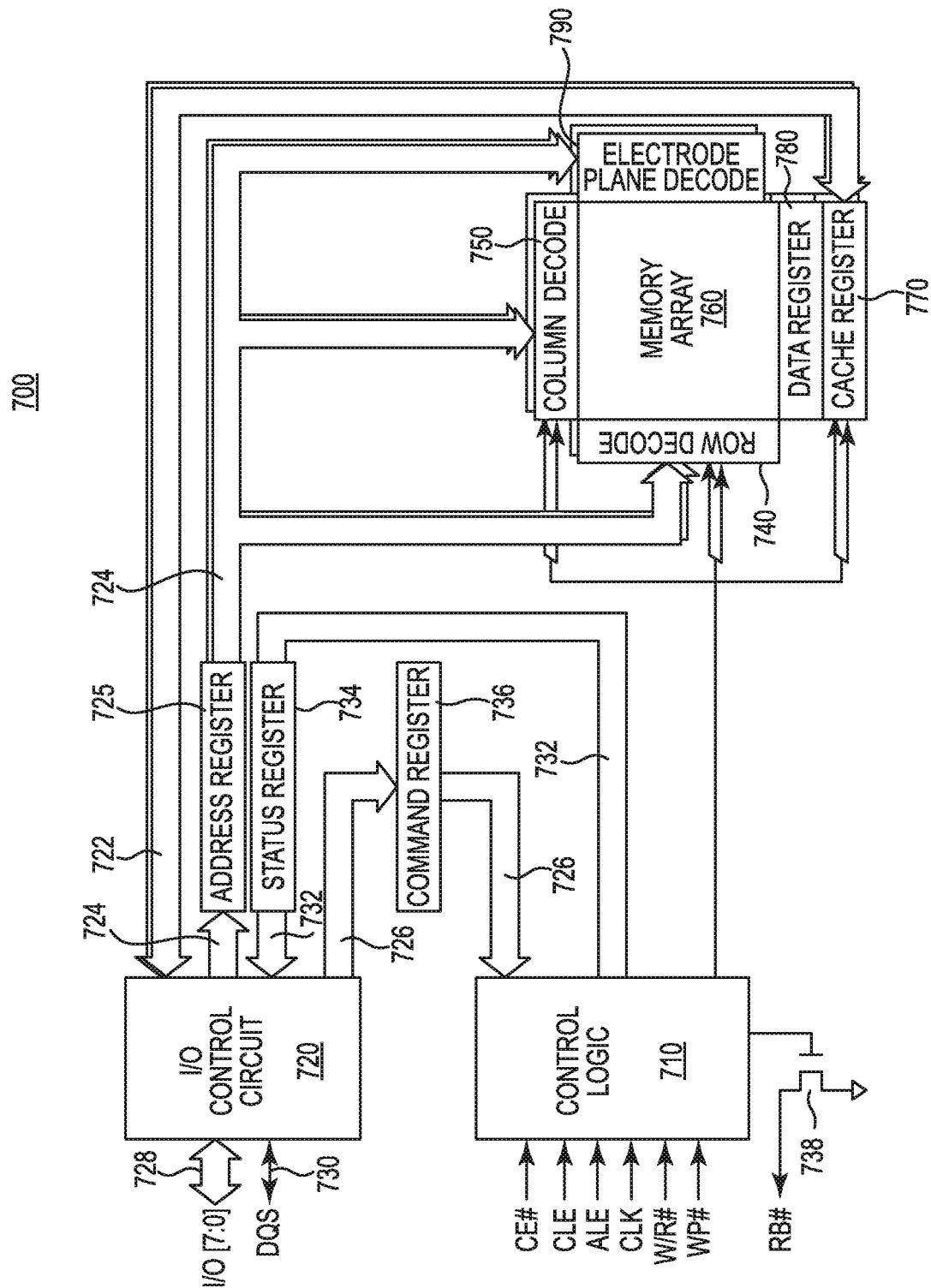
FIG. 7 is a functional block diagram of a memory according to an embodiment of the disclosure.

FIG. 7 illustrates a memory 700 according to an embodiment of the disclosure. The memory 700 includes a memory array 760 with a plurality of memory cells that are configured to store data. The memory cells may be accessed in the array through the use of various signal lines, word lines (WLs) and bit lines (BLs). The memory cells may be non-volatile memory cells, such as phase change memory cells, or may generally be any type of memory cells. The memory cells may be single level cells configured to store data for one bit of data. The memory cells may also be multi-level cells configured to store data for more than one bit of data.

Commands, address information, and write data may be provided to the memory 700 as sets of sequential input/output (I/O) transmitted through an I/O bus 728. Similarly, read data may be provided from the memory 700 through the I/O bus 728. A data strobe signal DQS may be transmitted through a data strobe bus 730. The DQS signal may be used to provide timing information for the transfer of data to the memory or from the memory. The I/O bus 728 is connected to an I/O control circuit 720 that routes data signals, address information signals, and other signals between the I/O bus 728 and an internal data bus 722, an internal address bus 724, and an internal command bus 726. An address register 725 may be provided address information by the I/O control circuit 720 to be temporarily stored. The I/O control circuit 720 is coupled to a status register 734 through a status register bus 732. Status bits stored by the status register 734 may be provided by the I/O control circuit 720 responsive to a read status command provided to the memory 700. The status bits may have respective values to indicate a status condition of various aspects of the memory and its operation.

The memory 700 also includes a control logic 710 that receives a number of control signals either externally (e.g., CE#, CLE, ALE, CLK, W/R#, and WP#) or through the command bus 726 to control the operation of the memory 700. A command register 736 is coupled to the internal command bus 726 to store information received by the I/O control circuit 720 and provide the information to the control logic 710. The control logic 710 may further access a status register 734 through the status register bus 732, for example, to update the status bits as status conditions change. The control logic 710 is further coupled to a ready/busy circuit 738 to control a value (e.g., logic value) of a ready/busy signal R/B# that may be provided by the memory 700 to indicate whether the memory is ready for an operation or is busy. The control logic 710 may be configured to provide internal control signals to various circuits of the memory 700. For example, responsive to receiving a memory access command (e.g., read and write), the control logic 710 may provide internal control signals to control various memory access circuits to perform a memory access operation. The various memory access circuits are used during the memory access operation, and may generally include circuits such as row and column decoders, signal line drivers, data 780 and cache registers 770, I/O circuits, as well as others.

The address register 725 provides block-row address signals to a row decoder 740 and column address signals to a column decoder 750. The row decoder 740 and column decoder 750 may be used to select blocks of memory cells for memory operations, for example, read and write operations. The row decoder 740 and/or the column decoder 750 may include one or more signal line drivers configured to provide a biasing signal to one or more of the access lines in the memory array 760, for example, the BLs and WLs of the memory array 760. In some embodiments, address register 725 may provide a separate electrode plane address to an electrode plane decoder 790. In some embodiments, the electrode plane address may be encoded in the row address and/or column address.

For a write operation, after the row address signals have been applied to the address bus 724, the I/O control circuit 720 routes write data signals to a cache register 770. The write data signals are stored in the cache register 770 in successive sets each having a size corresponding to the width of the I/O bus 728. The cache register 770 sequentially stores the sets of write data signals for an entire row or page of memory cells in the array 760. All of the stored write data signals are then used to write a row or page of memory cells in the array 760 selected by the block-row address coupled through the address bus 724. In a similar manner, during a read operation, data signals from a row or block of memory cells selected by the block-row address coupled through the address bus 724 are stored in a data register 780. The data register 780 and the cache register 770 may act as a single register for some page operations. For example, data stored in the data register 780 may be also stored in the cache register 770. Sets of data signals corresponding in size to the width of the I/O bus 728 are then sequentially transferred through the I/O control circuit 720 from the data register 780 and/or the cache register 770 to the I/O bus 728.

In some embodiments, during a write operation on a memory cell of the memory array 760, a first voltage (e.g., 0V) may be provided to a selected conductive pillar and a second voltage may be provided to a selected electrode plane. The memory cell may be at the intersection of the selected conductive pillar and electrode plane. The second voltage may be higher or lower than the voltage provided to the conductive pillar, based on the logic state to be stored at the address corresponding to the selected conductive pillar and electrode plane (e.g., −6V for '1' and +6V for '0'). In some embodiments, during a write operation, the selected conductive pillar may always be provided a specific voltage, and the electrode plane may be provided a voltage higher or lower than the voltage of the conductive pillar, based on the logic state to be stored at the address.

In some embodiments, during a read operation on a memory cell, a first voltage (e.g., 0V) may be provided to a selected conductive pillar and a second voltage (e.g., −5V, +5V) may be provided to a selected electrode plane. The memory cell may be at the intersection of the selected conductive pillar and electrode plane. The second voltage may be greater than or less than the first voltage provided to the conductive pillar, however, the second voltage may provide the same voltage polarity for every read operation. The logic state of the memory cell may be sensed by a sense amplifier coupled to the selected conductive pillar. The sensed logic state of the memory cell may be provided to the data register 780.

Memories in accordance with embodiments of the present invention may be used in any of a variety of electronic devices including, but not limited to, computing systems, electronic storage systems, cameras, phones, wireless devices, displays, chip sets, set top boxes, or gaming systems.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A memory device comprising:
    a stack comprising a plurality of electrode planes arranged in parallel and dielectric material disposed in between the plurality of electrode planes;
    a conductive pillar disposed through openings of the plurality of electrode planes; and
    a plurality of memory cells each associated with a respective electrode plane of the plurality of electrode planes and configured to be individually programmed through the conductive pillar and the respective electrode plane;
    wherein a memory cell of the plurality of memory cells is configured to exhibit a first threshold voltage or a second threshold voltage in read operations, and wherein the memory cell is further configured to act as a selector device.

2. The memory device of claim 1, wherein the plurality of memory cells comprise memory materials comprising at least chalcogenide.

3. The memory device of claim 2, wherein one or more memory cells associated with a same respective electrode plane are aligned in that respective plane.

4. The memory device of claim 3, wherein each of the one or more memory cells has a thickness equal to or less than a thickness of the respective plane.

5. The memory device of claim 1, wherein each of the plurality of memory cells is configured to be a two-terminal device between a respective electrode plane and the conductive cylinder.

6. The memory device of claim 5, wherein each of the plurality of memory cells is further configured to store one of at least a first logic state and a second logic state, wherein the first logic state corresponds to the first threshold voltage and the second logic state corresponds to the second threshold voltage.

7. The memory device of claim 6, wherein each of the plurality of memory cells is configured to exhibit the first threshold voltage when the memory cell is written with a first voltage and read with a second voltage in a same polarity with the first voltage.

8. The memory device of claim 6, wherein each of the plurality of memory cells is configured to exhibit the second threshold voltage when the memory cell is written with a first voltage and read with a second voltage in an opposite polarity with the first voltage.

9. A method comprising:
    selecting a memory cell of a plurality of memory cells, the memory cell arranged in a respective electrode plane of a plurality of electrode planes; and
    configuring the memory cell to:
        turn on or off; and
        store at least one of a first logic state and a second logic state.

10. The method of claim 9 further comprising biasing the memory cell by a difference between a first voltage and a second voltage to write data to the memory cell, wherein:
    the first logic state is written to the memory cell when the first voltage is greater than the second voltage; and
    the second logic state is written to the memory cell when the first voltage is less than the second voltage.

11. The method of claim 10, wherein biasing the memory cell comprises applying a write pulse to the memory cell.

12. The method of claim 11 further comprising reading the memory cell, wherein the memory cell exhibits one of a first threshold voltage or a second threshold voltage.

13. The method of claim 12, wherein the first logic state corresponds to the first threshold voltage and the second logic state corresponds to the second threshold voltage.

14. The method of claim 13, wherein reading the memory cell comprises applying a read pulse to the memory cell, wherein the memory cell exhibits the first threshold voltage when the read pulse is of a same polarity as the write pulse.

15. The method of claim 13, wherein reading the memory cell comprises applying a read pulse to the memory cell, wherein the memory cell exhibits the second threshold voltage when the read pulse is of opposite polarity as the write pulse.

16. An apparatus comprising:
a memory stack comprising:
a plurality of electrode planes arranged in parallel and dielectric material disposed in between the plurality of electrode planes;
a conductive pillar array of a plurality of pillars disposed vertically through openings of the plurality of electrode planes; and
a plurality of memory cells each associated with a respective electrode plane of the plurality of electrode planes; and
a decoder circuit configured to select a conductive pillar in the conductive pillar array and an electrode plane in the plurality of electrode planes to individually select a memory cell in the plurality of memory cells,
wherein the memory cell is configured to exhibit a first threshold voltage or a second threshold voltage during read operations, and wherein the memory cell is further configured to act as a selector device.

17. The memory device of claim 16, wherein the memory cell is a two-terminal device between the selected conductive pillar and the selected electrode plane, and wherein the memory cell comprises memory materials comprising at least chalcogenide.

18. The memory device of claim 17, wherein the memory cell is configured to, responsive to a read pulse in a first polarity in a read operation:
exhibit the first threshold voltage when a write pulse in the first polarity was applied to the memory cell in a write operation; or
exhibit the second threshold voltage when a write pulse in a second polarity was applied to the memory cell in a write operation, the second polarity is opposite to the first polarity.

19. The memory device of claim 18, wherein the memory cell is configured to store a first logic state or a second logic state, wherein the first logic state corresponds to the first threshold voltage and the second logic state corresponds to the second threshold voltage.

20. The memory device of claim 19, wherein the memory cell is configured to store the first logic state when a write pulse in the first polarity was applied to the memory cell, and to store the second logic state when a write pulse in the second polarity was applied to the memory cell.

* * * * *